(12) United States Patent
Chen

(10) Patent No.: US 7,990,715 B2
(45) Date of Patent: Aug. 2, 2011

(54) ELECTRICAL ASSEMBLY AND FASTENING ASSEMBLY THEREOF

(75) Inventor: Shun-Yi Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 198 days.

(21) Appl. No.: 12/406,127

(22) Filed: Mar. 18, 2009

(65) Prior Publication Data

US 2009/0237888 A1 Sep. 24, 2009

(30) Foreign Application Priority Data

Mar. 21, 2008 (CN) .......................... 2008 1 0300662

(51) Int. Cl.
*H05K 7/20* (2006.01)
*F28F 7/00* (2006.01)
*A44B 1/18* (2006.01)

(52) U.S. Cl. .................. 361/709; 361/679.54; 361/697; 361/704; 361/719; 165/80.3; 165/185; 174/16.3; 174/252; 257/719; 257/722; 24/458; 24/663; 24/459

(58) Field of Classification Search ............. 361/679.54, 361/697, 704, 709, 719; 165/80.1–80.3, 165/185; 174/16.1, 16.3, 252; 257/718–719, 257/722; 24/458, 459, 520, 453, 663
See application file for complete search history.

(56) References Cited

U.S. PATENT DOCUMENTS

| | | | |
|---|---|---|---|
| 5,754,412 A * | 5/1998 | Clavin ........................... | 361/804 |
| 6,307,748 B1 * | 10/2001 | Lin et al. ....................... | 361/704 |
| 6,418,025 B1 | 7/2002 | Lee | |
| 7,110,261 B2 * | 9/2006 | Lee et al. ....................... | 361/704 |
| 7,126,823 B2 * | 10/2006 | Chen et al. ..................... | 361/702 |
| 7,180,743 B2 * | 2/2007 | Chen et al. ..................... | 361/704 |
| 7,207,758 B2 * | 4/2007 | Leon et al. ..................... | 411/45 |
| 7,310,229 B2 * | 12/2007 | Lee et al. ....................... | 361/697 |
| 7,333,347 B1 * | 2/2008 | Liang ............................ | 361/810 |
| 7,869,217 B2 * | 1/2011 | Chen et al. .................... | 361/710 |
| 2003/0217835 A1 * | 11/2003 | Lee ............................... | 165/80.3 |
| 2008/0037225 A1 * | 2/2008 | Yang ............................. | 361/719 |

* cited by examiner

*Primary Examiner* — Zachary M Pape
(74) *Attorney, Agent, or Firm* — Frank R. Niranjan

(57) ABSTRACT

An electric assembly includes a heat sink defining a through hole and a notch communicating with the through hole; a circuit board defining a fixing hole; and a fastening assembly. The fastening assembly includes a fastener comprising a stem, a head connected one end of the stem, and a clamp connected to an opposite end of the stem; a limiting member comprising a main body slideably disposed on the stem and a limiting portion extending from the main body, the main body received into the through hole, and the limiting portion engageably inserted into the notch; and an elastic member disposed around the stem and between the head and the main body. Wherein the limiting portion is capable of sliding out of the notch and against the heat sink to compress the elastic member.

17 Claims, 7 Drawing Sheets

ELECTRICAL ASSEMBLY AND FASTENING ASSEMBLY THEREOF

BACKGROUND

1. Field of the Invention

Embodiments of the present disclosure generally relate to electrical assemblies, and particularly, to an electrical assembly with a heat sink.

2. Description of Related Art

Heat sink modules are widely used to dissipate heat from circuit boards, especially heat generated by chips on the circuit boards. A conventional heat sink module includes a heat sink and fasteners such as bolts and screws. Several through holes are usually defined in the heat sink, and the fasteners pass through the through holes and screwed into a circuit board. Thus the heat sink is fastened on the circuit board.

However, it is tedious and time consuming to disassembling the heat sink from the circuit board using a screwdriver to unscrew the fasteners out of the circuit board.

Therefore, a need exits for providing an electrical assembly with a heat sink module or a fastening assembly that can conveniently disassemble a heat sink from a circuit board.

DETAILED DESCRIPTION

Figure 1:
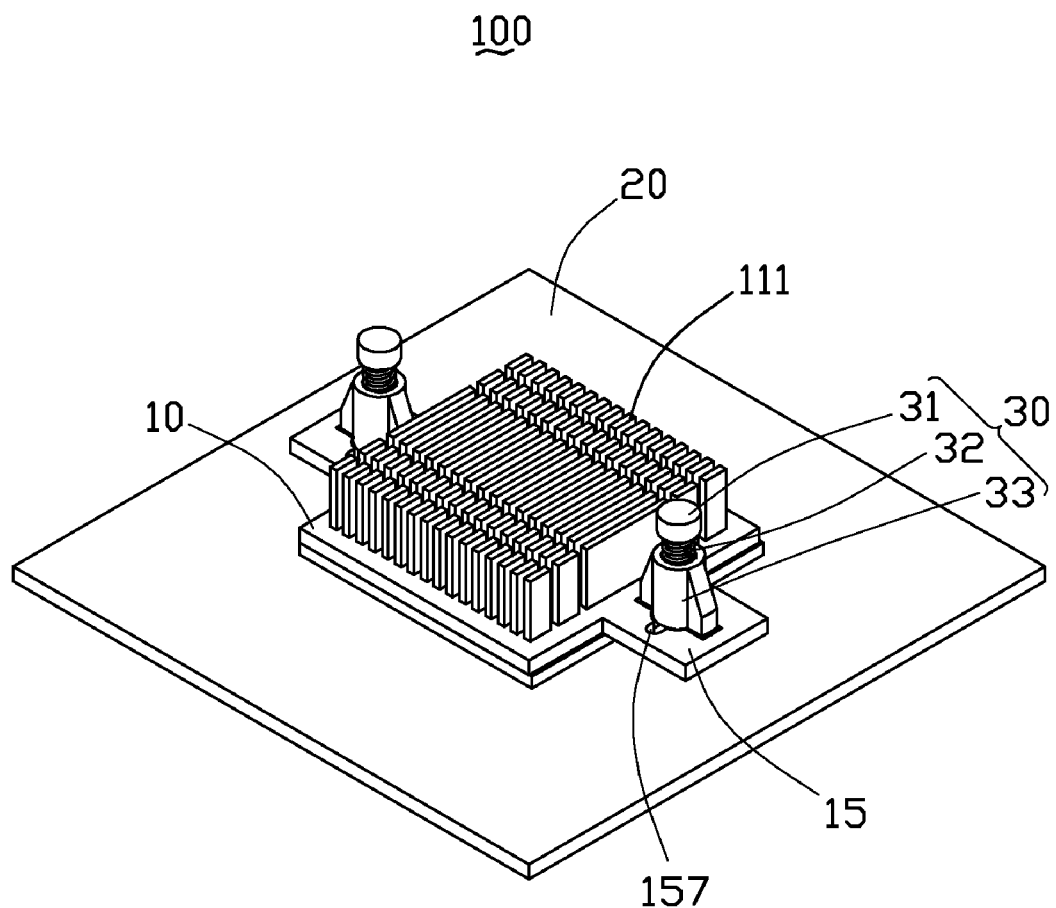
FIG. 1 is an isometric view of an electrical assembly in accordance with an exemplary embodiment.
Figure 2:
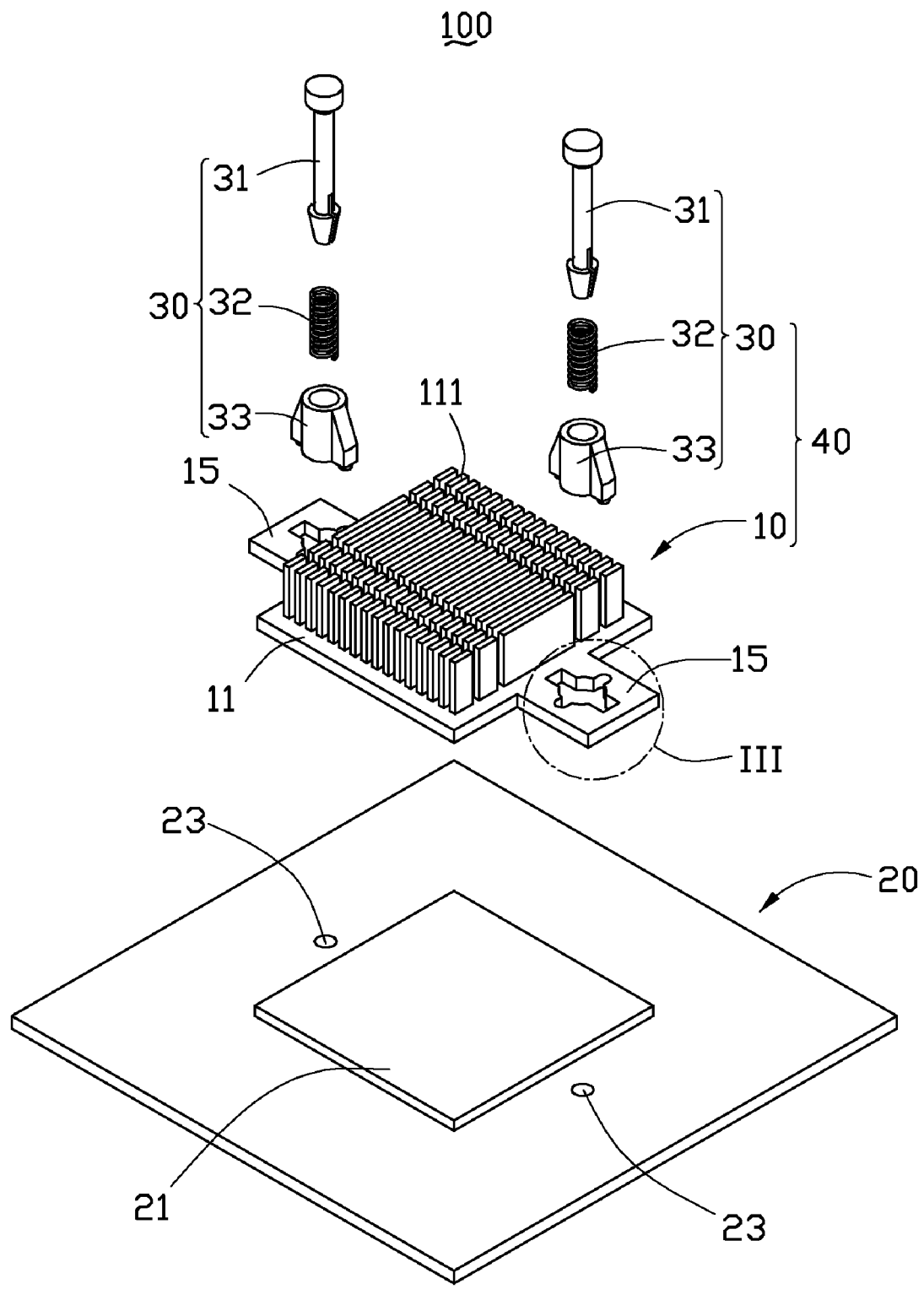
FIG. 2 is an exploded perspective view of the electrical assembly of FIG. 1.

Referring to FIG. 1 and FIG. 2, an electrical assembly 100 includes a circuit board 20 and a heat sink module 40 for dissipating heat from the circuit board 20. The circuit board 20 defines two fixing holes 23, and further includes a chip 21 disposed between the two fixing holes 23. The heat sink module 40 includes a heat sink 10 and two fastening assemblies 30 for attaching the heat sink 10 to the chip 21 of the circuit board 20.

Figure 3:
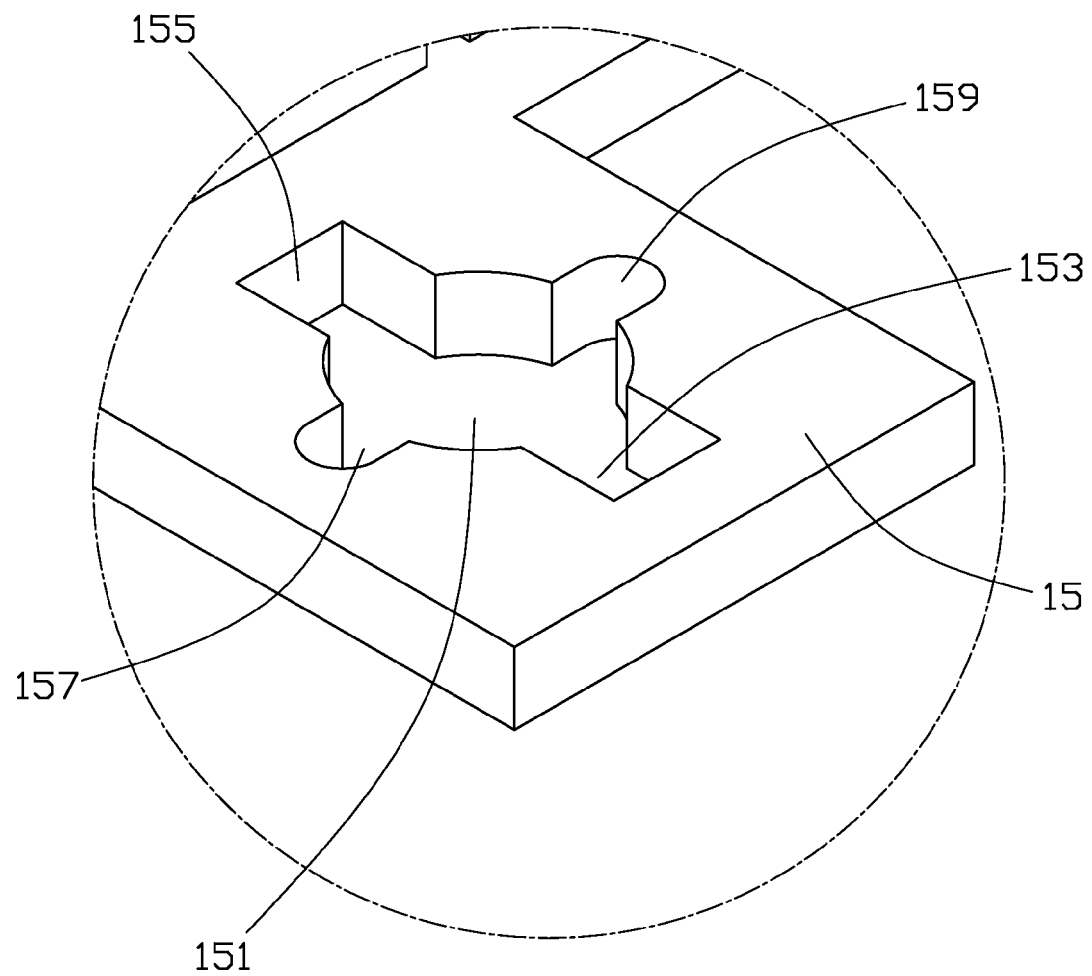
FIG. 3 is an enlarged view of a circled portion III of FIG. 2.

The heat sink 10 includes a chassis 11, multiple fins 111 mounted on the chassis 11, and a pair of fixing portions 15 extending outwards from opposite sides of the chassis 11. Further referring to FIG. 3, each of the fixing portions 15 defines a through hole 151 aligned with one of the two fixing holes 23 of the circuit board 20, two rectangular notches 153, 155, and two arched cutouts 157, 159. The two notches 153, 155 and the two cutouts 157, 159 are equally spaced around the through hole 151 in an alternating manner, and communicate with the through hole 151. The two cutouts 157, 159 are narrower than the notches 153, 155.

Each of the two fastening assemblies 30 includes a fastener 31, an elastic member 32 sleeved on the fastener 31, and a limiting member 33 slidablely attached to the fastener 31.

Figure 4:
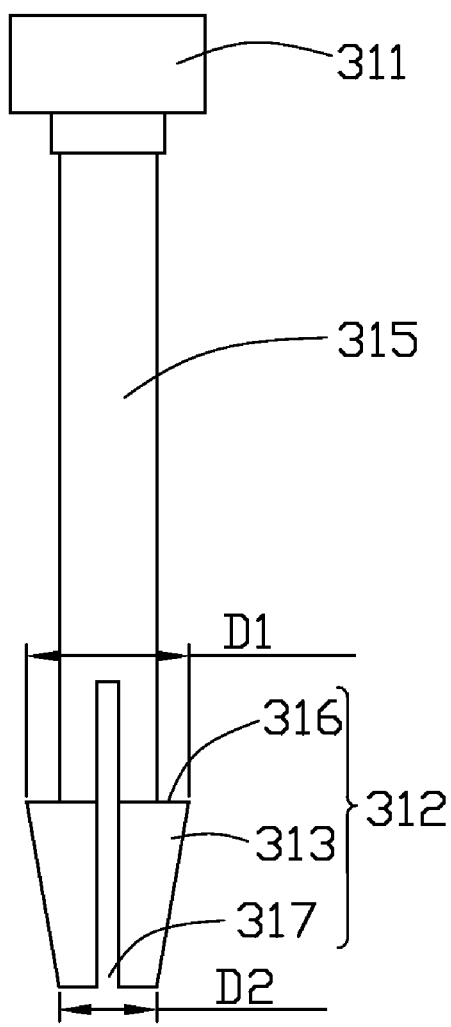
FIG. 4 is an enlarged view of a fastener of the electric assembly.

Further referring to FIG. 4, the fastener 31 includes a stem 315, a tapered clamp 312 connected to one end of the stem 315, and a head 311 connected to the other end of the stem 315. A barb 316 is thus formed on the fastener 31. As a whole, the clamp 312 has a truncated cone shape. A slot 317 is defined through the tapered clamp 312 and a part of the stem 315. Thus, the tapered clamp 312 is divided into two stops 313. When a force is applied to the two stops 313, the two stops 313 may deform and displace toward/closer to each other. When the stops 313 are not under a force, a maximum width D1 of the clamp 312 adjacent to the stem 315 is slightly lager than a diameter of the stem 315 and a diameter of the fixing hole 23 (see FIG. 2), and a minimum width D2 is smaller than the diameter of the fixing hole 23. When the stops 313 displace forward/closer to each other, the maximum width D1 of the clamp 312 becomes smaller (preferably, equals to the diameter of the fixing hole 23), such that, the clamp 312 can pass through the through hole 151 and the fixing holes 23.

Figure 5:
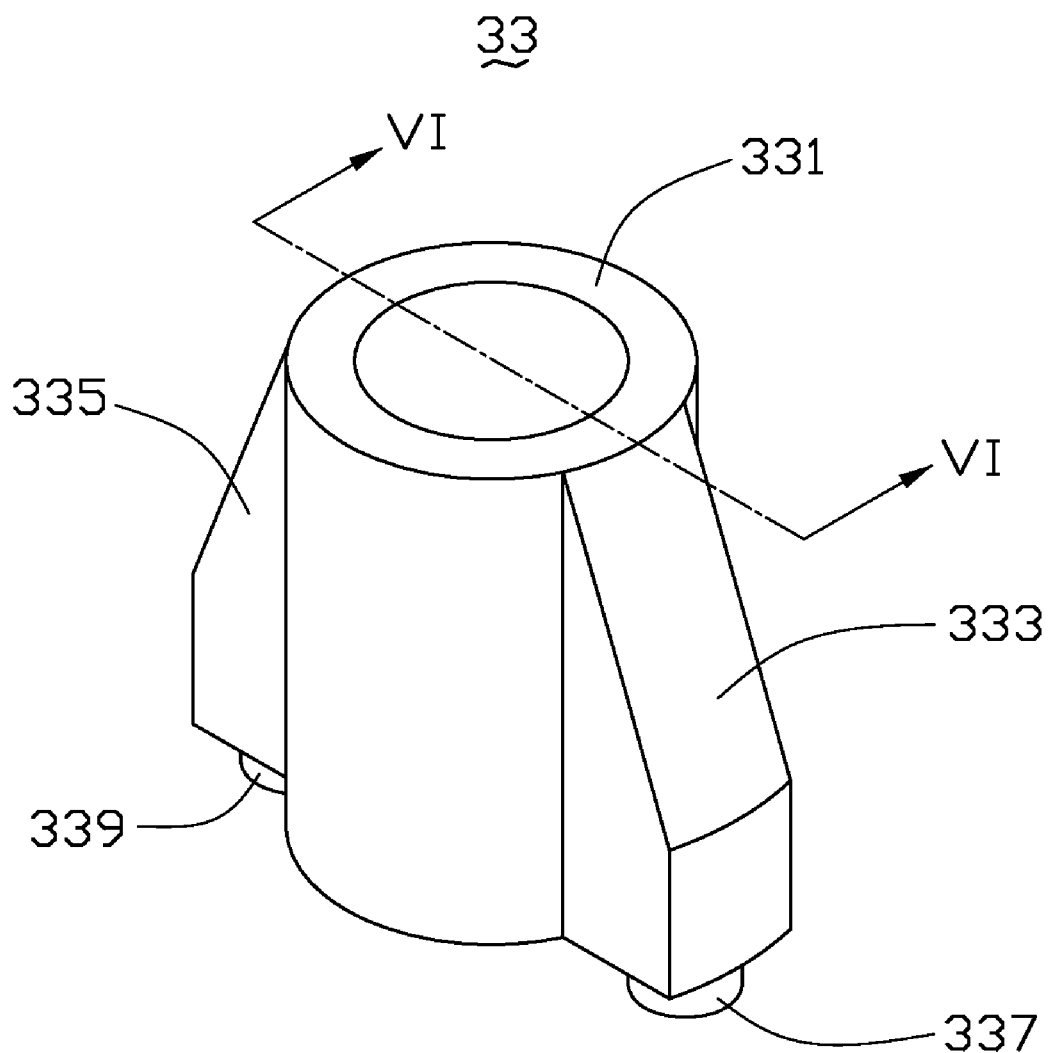
FIG. 5 is an enlarged view of a limiting member of the electric assembly.
Figure 6:
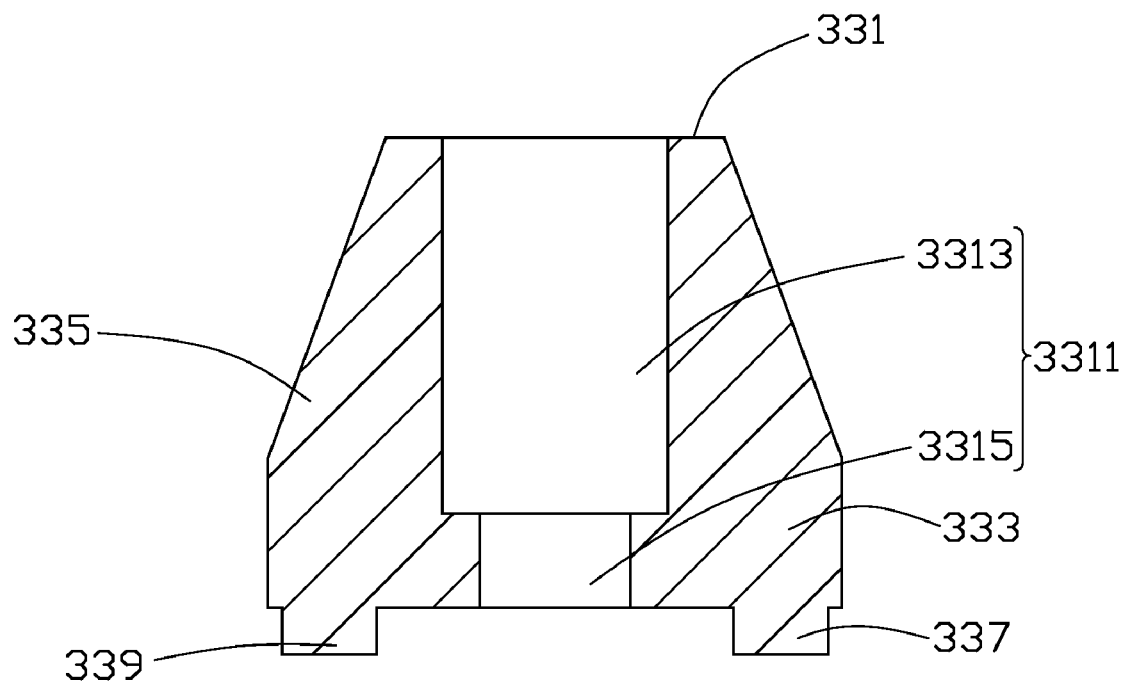
FIG. 6 is a cross-sectional view of the limiting member taken along the line VI-VI of FIG. 5.

The elastic member 32 is a spring, and sleeves on the stem 315 adjacent to the head 311. Further referring to FIGS. 5 and 6, the limiting member 33 includes a cylindrical main body 331, two limiting portions 333, 335 extending from opposing sides of the main body 331.

The main body 331 defines a through stepped hole 3311 in order to receive the stem 315 of the fastener 31. The through stepped hole 3311 is composed of a large-diameter hole 3313 and a small-diameter hole 3315 communicating with the large-diameter hole 3313. The large-diameter hole 3313 has a larger diameter than the small-diameter hole 3315, and a part of the elastic member 32 can be received in the large-diameter hole 3313 but cannot be received in the small-diameter hole 3315.

The two limiting portions 333, 335 are capable of engaging with the two notches 153, 155, but not capable of engaging with the cutouts 157, 159. The limiting portion 333 includes a positioning portion 337, and the limiting portion 335 includes a positioning portion 339. The positioning portions 337, 339 protrude from an end surface of the limiting members 333, 335 where an opening of the small-diameter hole 3315 is formed. The positioning portions 337, 339 are smaller than the limiting portions 333, 335, and are capable of engaging with the two cutouts 157, 159.

Figure 7:
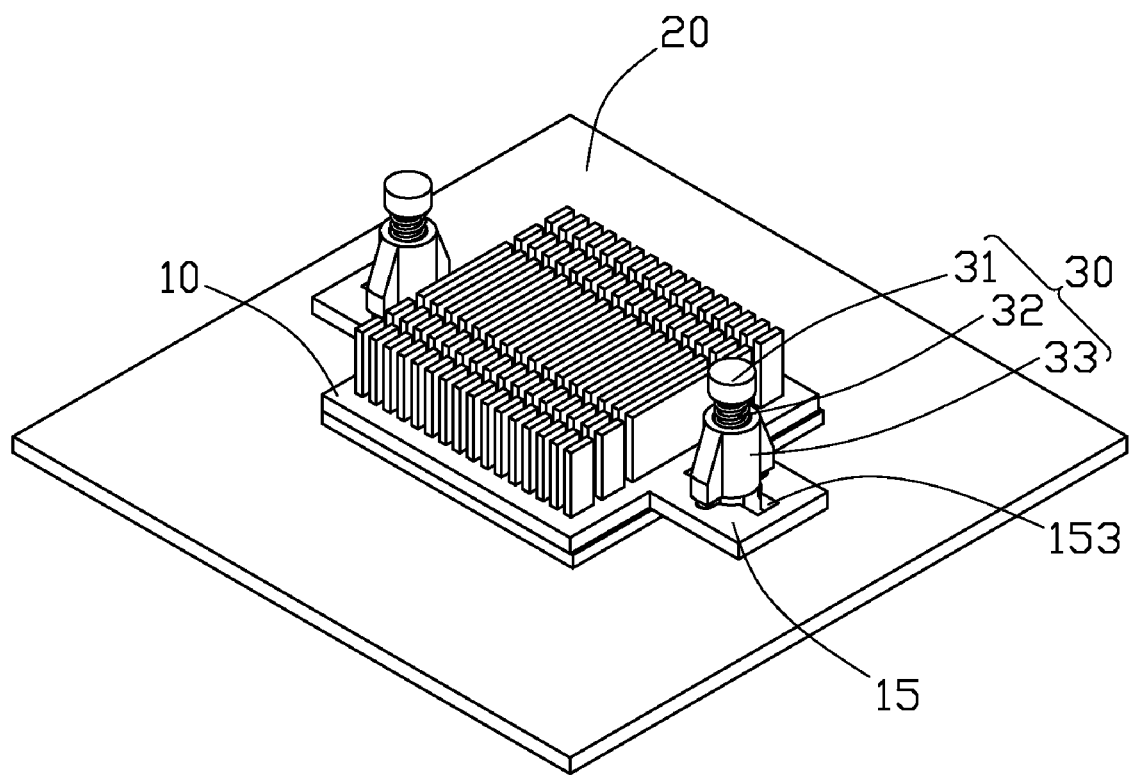
FIG. 7 is an isometric view of an electrical assembly of FIG. 1, a heat sink is fixed on a circuit board.

In assembly, the heat sink 10 is disposed on the circuit board 20. Firstly, the two through holes 151 are aligned with the two fixing holes 23. Secondly, the clamp 312 of the fastener 31 is passed through the elastic member 32 and the limiting member 33 sequentially to allow the elastic member 32 and the limiting member 33 to be able to sleeve on the stem 315 of the fastener 31, such that, the elastic member 32 is disposed between the head 311 of the fastener 31 and the limiting member 33. Thirdly, the fastener 31 is pressed to deform the clamp 312, and as a result, the clamp 312 is inserted into and through the through hole 151 and the fixing hole 23, the main body 331 of the limiting member 33 is received in the through hole 151, and the limiting portions 333, 335 are received in the notches 153, 155 (refer to FIG. 3). Then the limiting member 33 is slid along the stem 315 out of the through hole 151 and the notches 153, 155. Finally, the limiting member 33 is rotated around the stem 311 of the fastener 31 until the positioning portions 337, 339 are aligned with the cutouts 157, 159, and inserted into the cutouts 157, 159 correspondingly (referring to FIG. 7). Therefore, the heat sink 10 is conveniently assembled on the circuit board 20.

The elastic member 32 generates a pushing force to hold the limiting member 33, the heat sink 10, and the circuit board 20 against the clamp 312, thus, preventing the heat sink from separating from the circuit board 20. Furthermore, because the positioning members 337, 339 is smaller than the limiting portions 333, 335, the limiting member 33 is prevented from rotating relative to the heat sink 10, such that the heat sink 10 is securely fixed on the circuit board 20.

When the heat sink 10 is disassembled from the circuit board 20, a force is applied to deform the two stops 313 close to each other, thus the stops 313 can pass through the fixing hole 23, therefore, the heat sink 10 is conveniently separated from the circuit board 20.

It is to be understood, however, that even though numerous characteristics and advantages of the present disclosure have been set forth in the foregoing description, together with details of the structure and function of the present disclosure, the present disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An electric assembly comprising:
   a heat sink defining a through hole and a notch communicating with the through hole;
   a circuit board defining a fixing hole; and
   a fastening assembly comprising:
      a fastener comprising a stem, a head connected to one end of the stem, and a clamp connected an opposite end of the stem;
      a limiting member comprising a main body slidablely disposed on the stem and a limiting portion extending from the main body, the main body received into the through hole, and the limiting portion engageably inserted into the notch; and
      an elastic member disposed around the stem and between the head and the main body;
   wherein the limiting portion is capable of sliding out of the notch to allow the limiting member to compress the elastic member pressing the limiting member against the heat sink.

2. The electric assembly as claimed in claim 1, wherein the heat sink further defines a cutout communicating with the through hole and smaller than the limiting portion, and a positioning portion extends towards the heat sink from the limiting portion to be received in the cutout.

3. The electric assembly as claimed in claim 1, wherein the main body defines a through stepped hole composed of a large-diameter hole and a small-diameter hole, and a part of the elastic member can be received in the large-diameter hole.

4. The electric assembly as claimed in claim 1, wherein the clamp has a barb for preventing the fastener separating from the circuit board.

5. The electric assembly as claimed in claim 1, wherein the clamp comprises two stops connecting to the stem respectively, and further defines a slot between the two stops, and the two stops may deform when a force is applied towards the slot.

6. The electric assembly as claimed in claim 1, wherein the clamp has a conical outside surface, and a width of the clamp at an edge which is between the clamp and the stem is greater than a width of the stem at the edge.

7. A heat sink module comprising:
   a heat sink defining a through hole and a notch communicating with the through hole; and
   a fastening assembly comprising:
      a fastener comprising a stem, a head connected to one end of the stem, and a clamp connected to the other end of the stem;
      a limiting member comprising a main body slidablely sleeved on the stem and a limiting portion extending from the main body, the main body received in the through hole, and the limiting portion received in the notch; and
      an elastic member disposed between the limiting member and the head;
   wherein the limiting portion is capable of sliding out of the notch to allow the limiting member to compress the elastic member pressing the limiting member against the heat sink.

8. The heat sink module as claimed in claim 7, wherein the heat sink further defines a cutout communicating with the through hole and smaller than the limiting portion, and a positioning portion extending towards the heat sink from the limiting portion to be received in the cutout.

9. The heat sink module as claimed in claim 7, wherein the main body defines a through stepped hole composed of a large-diameter hole and a small-diameter hole, and a part of the elastic member can be received in the large-diameter hole.

10. The heat sink module as claimed in claim 7, wherein the clamp has a barb.

11. The heat sink module as claimed in claim 7, wherein the clamp comprises two stops connecting to the stem respectively, and further defines a slot between the two stops, and the two stops may deform when a force is applied towards the slot.

12. The heat sink module as claimed in claim 7, wherein the clamp has a conical outside surface, and a width of the clamp at an edge which is between the clamp and the stem is greater than a width of the stem at the edge.

13. A fastening assembly for fastening a to be fastened member on a supporting board, the to be fastened member defining a through hole and a notch communicating with the through hole, the fastening assembly comprising:
   a fastener comprising a stem, a head connected to one end of the stem, and a clamp connected to an opposite end of the stem;
   a limiting member comprising a main body slidablely sleeved on the stem and a limiting portion extending from the main body, the main body received in the through hole, and the limiting portion received in the notch; and
   an elastic member disposed between the limiting member and the head;
   wherein the limiting portion is capable of sliding out of the notch to allow the limiting member to compress the elastic member pressing the limiting member against the to be fastened member.

14. The fastening assembly as claimed in claim 13, wherein the main body defines a through stepped hole composed of a large-diameter hole and a small-diameter hole, and a part of the elastic member can be received in the large-diameter hole.

15. The fastening assembly as claimed in claim 13, wherein the clamp has a barb.

16. The fastening assembly as claimed in claim 13, wherein the clamp comprises two stops connecting to the stem respectively, and further defines a slot between the two stops, and the two stops may deform when a force is applied towards the slot.

17. The fastening assembly as claimed in claim 13, wherein the clamp has a conical outside surface, and a width of the clamp at an edge which is between the clamp and the stem is greater than a width of the stem at the edge.

* * * * *